(12) United States Patent
Rinner et al.

(10) Patent No.: US 11,073,913 B2
(45) Date of Patent: Jul. 27, 2021

(54) DEVICE FOR PRODUCING HAPTIC FEEDBACK

(71) Applicant: TDK Electronics AG, Munich (DE)

(72) Inventors: Franz Rinner, Deutschlandsberg (AT); Harald Kastl, Deutschlandsberg (AT)

(73) Assignee: TDK ELECTRONICS AG, Munich (DE)

( * ) Notice: Subject to any disclaimer, the term of this patent is extended or adjusted under 35 U.S.C. 154(b) by 0 days.

(21) Appl. No.: 16/331,511

(22) PCT Filed: Aug. 3, 2017

(86) PCT No.: PCT/EP2017/069708
§ 371 (c)(1),
(2) Date: Mar. 7, 2019

(87) PCT Pub. No.: WO2018/046201
PCT Pub. Date: Mar. 15, 2018

(65) Prior Publication Data
US 2019/0196597 A1   Jun. 27, 2019

(30) Foreign Application Priority Data
Sep. 7, 2016   (DE) .......................... 102016116763.0

(51) Int. Cl.
*H01L 41/09* (2006.01)
*H02N 2/04* (2006.01)
(Continued)

(52) U.S. Cl.
CPC .......... *G06F 3/016* (2013.01); *H01L 41/0986* (2013.01); *H02N 2/043* (2013.01);
(Continued)

(58) Field of Classification Search
CPC ..... G06F 3/016; G06F 3/041; H01L 41/0986; H01L 41/083; H01L 41/1876; H01L 41/273; H02N 2/043
See application file for complete search history.

(56) References Cited

U.S. PATENT DOCUMENTS 4,999,819 A * 3/1991 Newnham ............. B06B 1/0644
310/334
5,276,657 A   1/1994 Newnham et al.
(Continued)

FOREIGN PATENT DOCUMENTS

CN   102394270 A   3/2012
DE   10017332 A1   10/2001
(Continued)

*Primary Examiner* — Julie Anne Watko
(74) *Attorney, Agent, or Firm* — Slater Matsil, LLP

(57) ABSTRACT

In an embodiment a device includes at least one piezoelectric actuator including a plurality of piezoelectric layers and a first reinforcing element and a second reinforcing element, wherein the piezoelectric actuator is arranged between the reinforcing elements, wherein the piezoelectric actuator is configured to alter its expansion in a first direction when an electrical voltage is applied, and wherein the reinforcing elements are configured to deform on account of a change in an expansion of the piezoelectric actuator such that a central region of the respective reinforcing element is moved relative to the piezoelectric actuator in a second direction, the second direction being perpendicular to the first direction.

15 Claims, 4 Drawing Sheets

(51) Int. Cl.
*G06F 3/041* (2006.01)
*H01L 41/083* (2006.01)
*G06F 3/01* (2006.01)
H01L 41/187 (2006.01)
H01L 41/273 (2013.01)

(52) U.S. Cl.
CPC ............ *G06F 3/041* (2013.01); *H01L 41/083* (2013.01); *H01L 41/1876* (2013.01); *H01L 41/273* (2013.01)

(56) References Cited

U.S. PATENT DOCUMENTS

| | | | |
|---|---|---|---|
| 5,729,077 A * | 3/1998 | Newnham | H02N 2/043 |
| | | | 310/328 |
| 6,294,859 B1 | 9/2001 | Jaenker | |
| 6,465,936 B1 | 10/2002 | Knowles et al. | |
| 6,717,333 B2 | 4/2004 | Hermle et al. | |
| 8,362,882 B2 | 1/2013 | Heubel et al. | |
| 8,982,067 B2 | 3/2015 | Sanma et al. | |
| 10,242,821 B2 | 3/2019 | Tan et al. | |
| 10,345,910 B1 * | 7/2019 | Khoshkava | B06B 1/0688 |
| 2005/0168108 A1 * | 8/2005 | Face | H01H 13/7006 |
| | | | 310/330 |
| 2009/0002328 A1 * | 1/2009 | Ullrich | G06F 3/016 |
| | | | 345/173 |
| 2009/0115292 A1 | 5/2009 | Ueda et al. | |
| 2009/0303839 A1 * | 12/2009 | Narayanan | G10K 9/121 |
| | | | 367/164 |
| 2010/0090813 A1 * | 4/2010 | Je | G06F 3/016 |
| | | | 340/407.2 |
| 2010/0096949 A1 * | 4/2010 | Xu | H01L 41/083 |
| | | | 310/332 |
| 2014/0096565 A1 | 4/2014 | Gregorski et al. | |
| 2015/0154885 A1 * | 6/2015 | Livermore-Clifford | |
| | | | G09B 21/003 |
| | | | 434/114 |
| 2015/0261259 A1 * | 9/2015 | Endo | G06F 1/1618 |
| | | | 361/679.06 |
| 2015/0309576 A1 | 10/2015 | Tissot | |
| 2015/0318462 A1 * | 11/2015 | Kim | H01L 41/183 |
| | | | 310/332 |
| 2016/0027263 A1 | 1/2016 | Parker et al. | |
| 2016/0147305 A1 * | 5/2016 | Hong | G06F 3/0412 |
| | | | 345/175 |
| 2016/0266691 A1 * | 9/2016 | Jang | G06F 3/044 |
| 2016/0323966 A1 * | 11/2016 | Hamel | H05B 33/26 |
| 2017/0153703 A1 * | 6/2017 | Yun | G06F 3/03547 |
| 2017/0153706 A1 | 6/2017 | Usui et al. | |
| 2017/0316733 A1 * | 11/2017 | Du | H01L 27/3225 |
| 2018/0081438 A1 * | 3/2018 | Lehmann | G06F 3/041 |
| 2018/0120938 A1 * | 5/2018 | Frescas | H01L 41/1136 |
| 2019/0103821 A1 * | 4/2019 | Lim | H01L 41/053 |
| 2019/0384395 A1 * | 12/2019 | Khoshkava | B06B 1/0238 |
| 2020/0057525 A1 * | 2/2020 | Prest | G06F 3/04883 |
| 2020/0078260 A1 * | 3/2020 | Choudhury | A61H 19/30 |

FOREIGN PATENT DOCUMENTS

| | | | | |
|---|---|---|---|---|
| DE | 69635870 T2 | 11/2006 | | |
| DE | 102015117262 A1 | 4/2017 | | |
| EP | 0902488 A1 | 3/1999 | | |
| FR | 3000301 A1 * | 6/2014 | ............ | H01L 41/25 |
| JP | H06338640 A | 12/1994 | | |
| JP | H11146664 A | 5/1999 | | |
| JP | 2011206634 A | 10/2011 | | |
| JP | 2012221387 A | 11/2012 | | |
| KR | 1020120013273 B1 | 2/2012 | | |
| TW | M393736 U | 12/2010 | | |
| TW | 201506686 A | 2/2015 | | |
| WO | WO-2013186597 A1 * | 12/2013 | .......... | G06F 1/1643 |
| WO | 2014096565 A1 | 6/2014 | | |
| WO | 2016027708 A1 | 2/2016 | | |

* cited by examiner

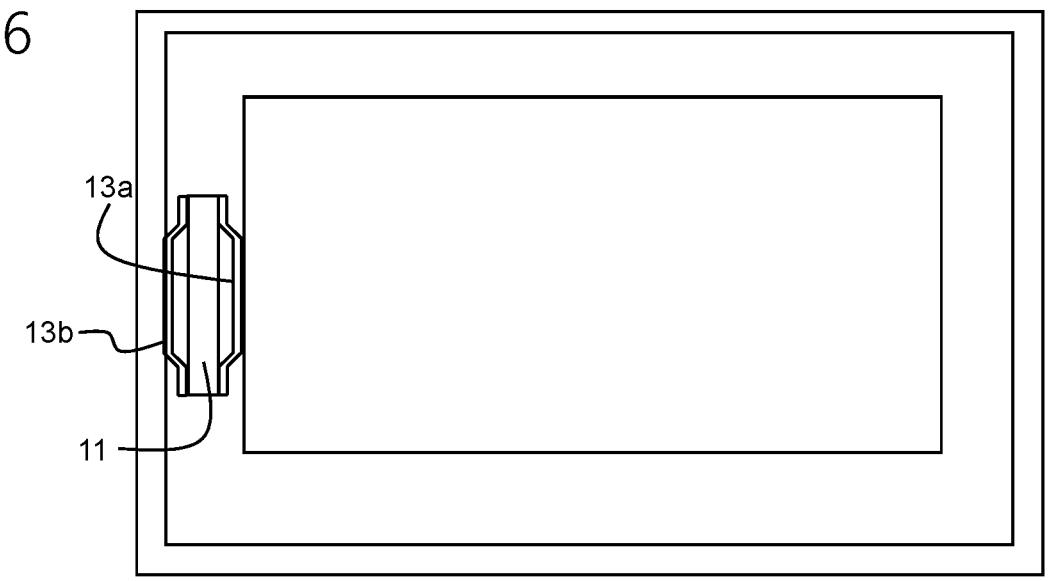

DEVICE FOR PRODUCING HAPTIC FEEDBACK

This patent application is a national phase filing under section 371 of PCT/EP2017/069708, filed Aug. 3, 2017, which claims the priority of German patent application 102016116763.0, filed Sep. 7, 2016, each of which is incorporated herein by reference in its entirety.

TECHNICAL FIELD

The invention relates to a device for producing haptic feedback. The invention further relates to an electronic apparatus comprising the device for producing haptic feedback. The invention furthermore relates to the use of the device as a drive for haptic feedback.

BACKGROUND

In touch-sensitive screens, artificially produced haptic feedback is desired when a virtual key is pressed, in order to improve the operability. This is of importance in the automotive field, in particular, since a user cannot permanently look at the screen. The haptic feedback can be used, for example, to communicate to the user the fact that settings carried out by the user are successfully implemented.

However, existing devices for producing haptic feedback are usually very complex and have an inefficient transmission.

SUMMARY OF THE INVENTION

Embodiments provide an improved device for producing haptic feedback, for example, a device which is particularly simple, space-saving and/or cost-effective.

According to an embodiment, a device for producing haptic feedback is specified. The device serves as a drive for haptic feedback. The device is configured to produce haptic feedback for electronic apparatuses, for example, for touch-sensitive screens. By way of example, the device is intended to be configured to bring about an offset of the screen parallel to a screen surface.

In a simplified representation, screen and device (drive) correspond to an oscillatory mass-spring system. In this case, the resonant frequency $f_o$ (frequency of the free oscillation without excitation) results as: $f_o = \frac{1}{2\pi} \cdot \sqrt{(D/m)}$. D is the stiffness of the drive or of the device. m is the mass of the screen. m is generally between 300 g and 400 g.

The device has a specific minimum stiffness D so that the desired offset of the screen can be achieved. $f_o$ must be greater than the reciprocal of the excursion duration T, otherwise the screen does not move or only partly moves concomitantly. An offset is intended generally to have a duration of between 7 ms and 10 ms. It thus holds true that: $D \geq m \cdot (2\pi/T)^2$. Given T=7 ms and m=400 g this results in a minimum stiffness of 0.32 N/μm for the device (drive). The stiffness is influenced, for example, by a geometry and/or a material and/or a thickness or vertical extent of the device or the components thereof.

The device comprises at least one piezoelectric actuator. The actuator comprises a multiplicity of piezoelectric layers. Internal electrodes are arranged between the piezoelectric layers. Piezoelectric layers and internal electrodes are arranged one above another to form a stack. The stack height is preferably less than or equal to 3 mm.

The device furthermore comprises a first reinforcing element. The device comprises a second reinforcing element. The piezoelectric actuator is arranged between the reinforcing elements. The reinforcing elements serve for increasing the stiffness of the device. The reinforcing elements furthermore serve for stroke amplification.

The reinforcing elements are arranged in a stacking direction of the piezoelectric layers at least partly on a top side and an underside of the actuator. The device is formed symmetrically about a horizontal axis or longitudinal axis of the device.

The piezoelectric actuator is configured and arranged to alter its expansion in a first direction when an electrical voltage is applied. Preferably, when an electrical voltage is applied, the expansion of the piezoelectric actuator takes place transversely with respect to the polarization direction of the piezoelectric layers and with respect to the electric field (d31 effect). Preferably, when an electrical voltage is applied, the expansion takes place transversely with respect to the stacking direction of the piezoelectric layers.

The respective reinforcing element is formed in integral fashion. Preferably, the respective reinforcing element has a partial region. The reinforcing elements are configured and arranged to deform on account of the change in the expansion of the piezoelectric actuator in such a way that the partial region of the respective reinforcing element is moved relative to the piezoelectric actuator in a second direction. The second direction is perpendicular to the first direction. The second direction preferably extends along the stacking direction of the piezoelectric layers.

As mentioned above, the stroke of the actuator is amplified by the reinforcing elements. An effective drive for producing haptic feedbacks is thus made available. By virtue of the small stack height, as a separating process it is possible to use "cutting" instead of "sawing". Furthermore, the contacting of the actuator is simplified. Both lower the production complexity and hence the costs. Furthermore, only a small space requirement is needed on account of the small height. Overall a device is provided which not only provides the required deflection for producing haptic feedback but is also simple, cost-effective and compact.

In accordance with one exemplary embodiment, the reinforcing elements each have at least one end region. Preferably, each reinforcing element has two end regions. The respective reinforcing element is preferably formed in rectangular or strip-shaped fashion. The respective reinforcing element has a length and a width. The length is greater than the width of the reinforcing element by a multiple. By way of example, the length is 5 times, 10 times, 12 times or 15 times the width. By way of example, the width of the respective reinforcing element is between 3 mm and 10 mm. By way of example, the length of the respective reinforcing element is between 50 mm and 100 mm.

The end regions are situated respectively in the region of the end faces of the reinforcing element. The respective end region is directly adjacent to the respective partial region. In particular, the respective partial region transitions into an end region toward both (end)sides. The partial region thus constitutes a central region of the reinforcing element.

The end region is configured and arranged in such a way that upon a change in the expansion of the piezoelectric actuator, a movement of the end region in the second direction does not occur. A relative movement between the respective end region and the partial region of the reinforcing element thus occurs. The haptic feedback is produced by the relative movement of the respective end region with respect to the respective partial region. A simple and effective device is thus provided.

Preferably, the end region is in each case directly at the piezoelectric actuator. Preferably, the end regions of the first reinforcing element bear on a top side, at least on partial regions of the top side, of the actuator, Preferably, the end regions of the second reinforcing element bear on an underside, at least on partial regions of the underside, of the actuator.

Preferably, the respective end region and the piezoelectric actuator are connected to one another by an adhesive connection. A simple, cost-effective and effective connection between reinforcing element and actuator is thus achieved. The necessary stiffness of the device is ensured. Moreover, the geometry of the reinforcing elements is simplified as a result. Complicated geometries for forming a clamping connection between reinforcing element and actuator can be dispensed with, in particular.

Preferably, the respective reinforcing element comprises a metal strip. The metal strip is preferably rolled. The respective reinforcing element can comprise a sheet-metal strip. The respective reinforcing element is preferably formed in flat fashion, that is to say has only a small maximum thickness. The maximum thickness or vertical extent of the reinforcing element is preferably less than or equal to 1.0 mm. A particularly space-saving device is thus achieved.

The respective reinforcing element is embodied as curved or bent. In particular, the reinforcing element has regions or sections which do not extend along a plane, but rather form an angle with respect to a longitudinal axis of the reinforcing element (oblique sections). By contrast, other regions or sections extend parallel to the longitudinal axis. Parallel and oblique sections merge directly or straight into one another. The specific shaping of the reinforcing elements serves to ensure the required stiffness of the device.

In accordance with one exemplary embodiment, the respective partial region is arranged at a distance from a surface of the piezoelectric actuator. In particular, there is a free space situated between the partial region and a top side and/or an underside of the actuator. The movement of the partial region in the second direction is made possible as a result. A maximum height or vertical extent of the free space amounts, for example, to less than or equal to 2.5 mm, for example, 1.2 mm. Accordingly, the device itself has a thickness of less than or equal to 10 mm. A compact and space-saving device can be made available as a result.

In accordance with one exemplary embodiment, the respective reinforcing element has at least one thinned portion, preferably a plurality of thinned portions. By virtue of the thinned portion, the thickness of the reinforcing element is reduced pointwise. The thinned portion has a depth or vertical extent of less than or equal to 0.8 mm, for example, 0.75 mm. The respective reinforcing element bends at the location of the thinned portion upon the movement in the second direction. A simple and stable reinforcing element is achieved as a result. The transmission becomes movable for the actuator and stiff for the load (screen) as a result of the thinned portion. The efficiency of the transmission is increased as a result.

In accordance with one exemplary embodiment, the thinned portion has an indentation in a surface of the respective reinforcing element. By way of example, the thinned portion comprises a notch. The thinned portion can be formed at a top side and/or an underside of the respective reinforcing element. The thinned portion can be stamped or milled into a surface of the reinforcing element. The thinned portion can have a round or angular profile.

In accordance with one exemplary embodiment, a thinned portion is formed in a transition region between the partial region and the end region of the respective reinforcing element. As a result, the reinforcing element can bend in the transition region. A loading of the connection between the end region of the reinforcing element and the actuator can thus be reduced.

In accordance with one exemplary embodiment, the respective partial region has a central region. The respective partial region furthermore has at least one connection region, preferably two connection regions. The connection regions are adjacent to the central region from two sides (end sides). The connection regions connect the central region of the respective partial region to the two end regions.

The central region extends parallel to a surface of the piezoelectric actuator. The connection region extends obliquely with respect to the surface of the piezoelectric actuator. A thinned portion is formed in a transition region between the central region and the connection region. By virtue of the thinned portion, the reinforcing element can bend in the transition region.

In accordance with a further aspect, an electronic apparatus is specified. The electronic apparatus comprises a device for producing haptic feedback. The device corresponds in particular to the device described above. All features that have been described in association with the device are also applied hereinafter to the electronic apparatus.

The device constitutes a drive for haptic feedback. The electronic apparatus comprises a first mechanical element, for example, a touch-sensitive screen. The electronic apparatus comprises a second mechanical element, for example, a weight or a housing element. The first reinforcing element is secured to the first mechanical element and the second reinforcing element is secured to the second mechanical element, or vice versa. In particular, the reinforcing elements are secured to the mechanical elements in such a way that upon a deformation of the piezoelectric actuator, the mechanical elements are moved relative to one another. Consequently, an offset of the screen parallel to the screen surface and hence haptic feedback for the user are brought about. A particularly user-friendly electrical apparatus is thus achieved.

In accordance with a further aspect, the use of a device is described. In particular, the use of the device described above is specified. All features that have been described in association with the device are also applied to the use. In particular, the device is used as a drive for haptic feedback in touch-sensitive screens in the automotive field. A simple, cost-effective, space-saving and efficient drive which can be used to produce haptic feedback for the user is made available by the device.

BRIEF DESCRIPTION OF THE DRAWINGS

The invention is explained in greater detail below on the basis of exemplary embodiments and with reference to the associated figures.

The drawings described below should not be interpreted as true to scale. Rather, individual dimensions may be illustrated as enlarged, reduced or even distorted for the sake of better illustration.

Elements which are identical to one another or which perform the same function are designated by identical reference signs.

Figure 1:
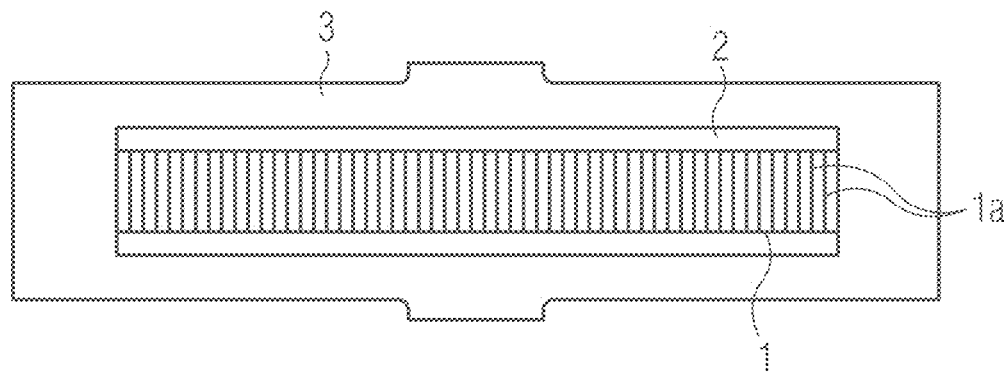
Figure 2:
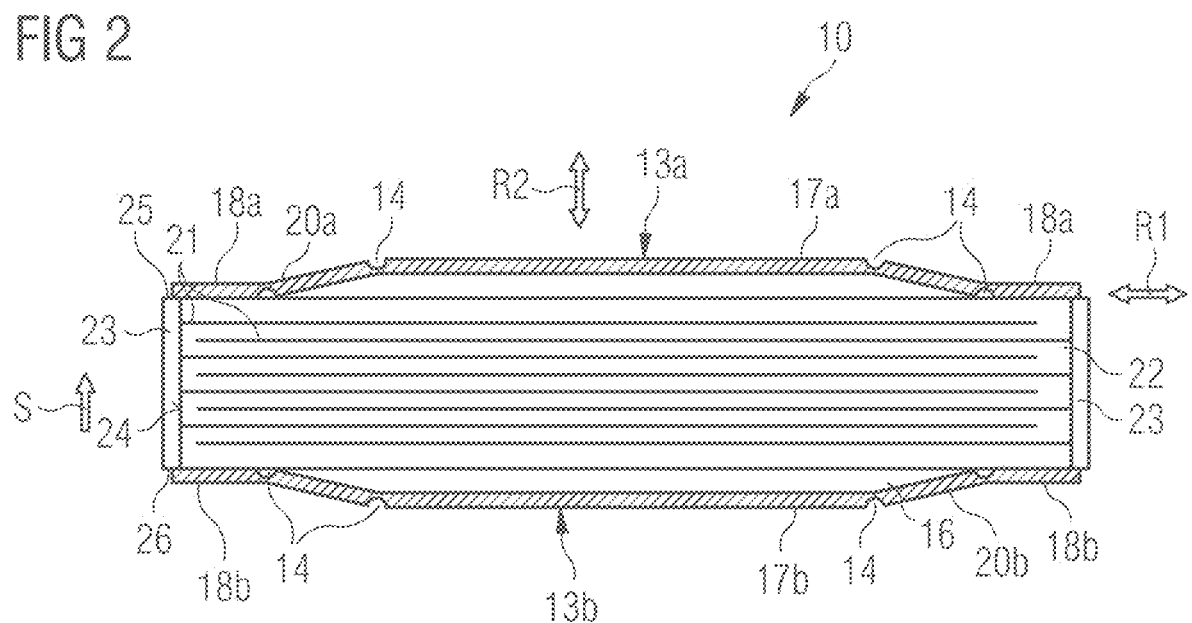
Figure 3:
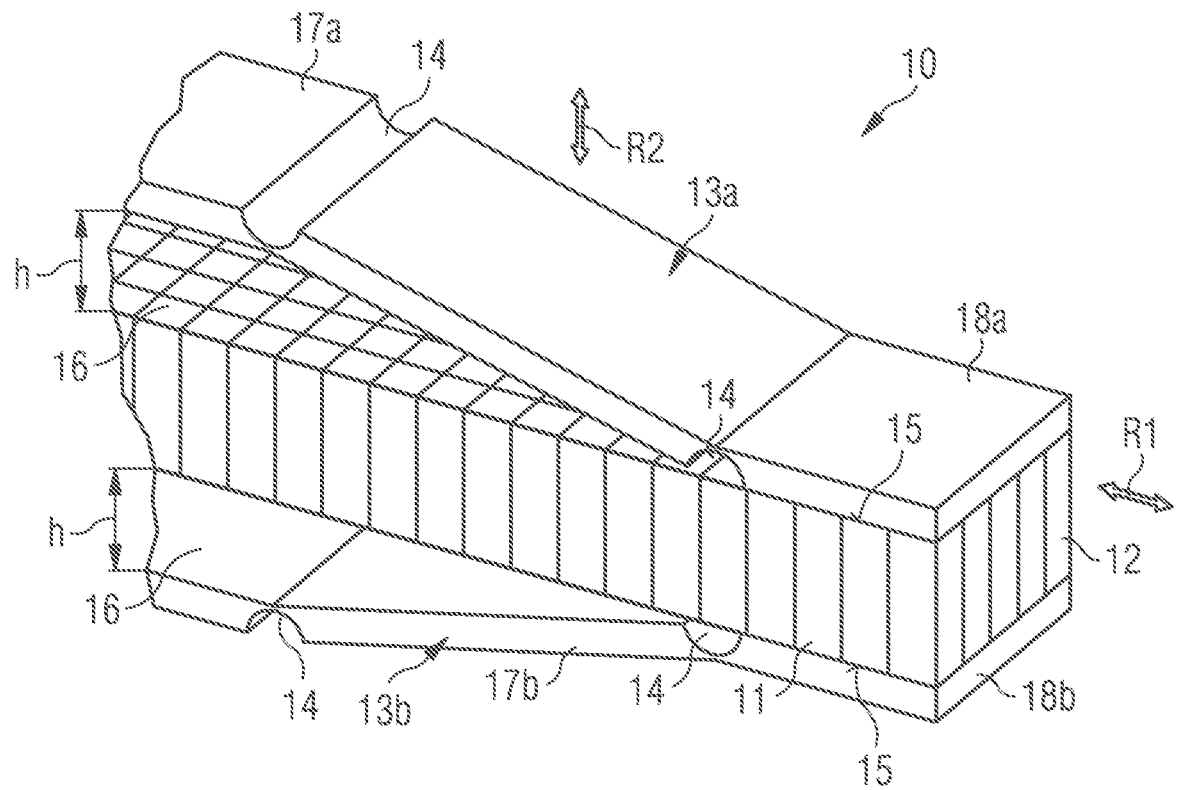
Figure 4:
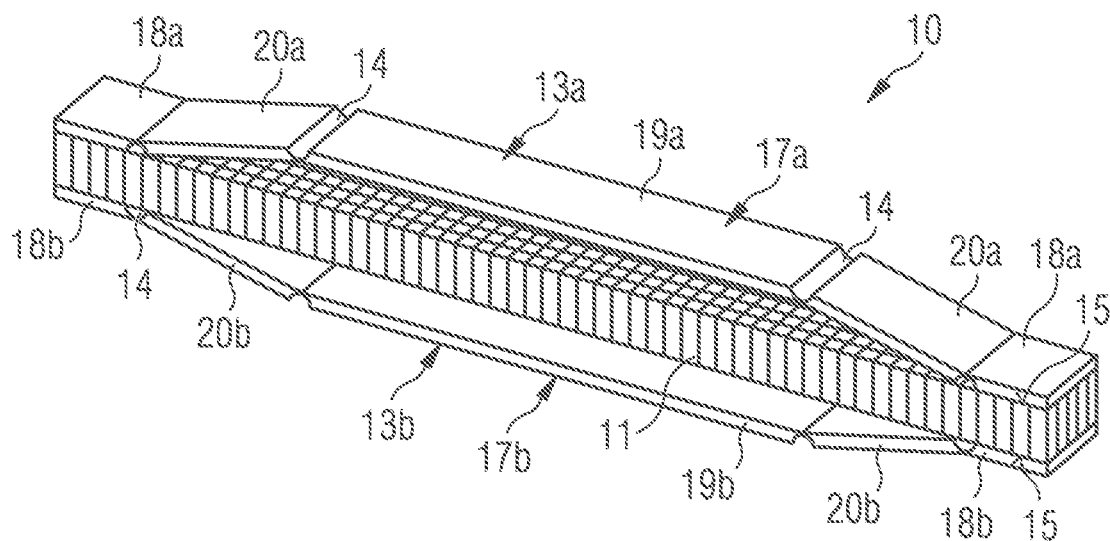
Figure 5:
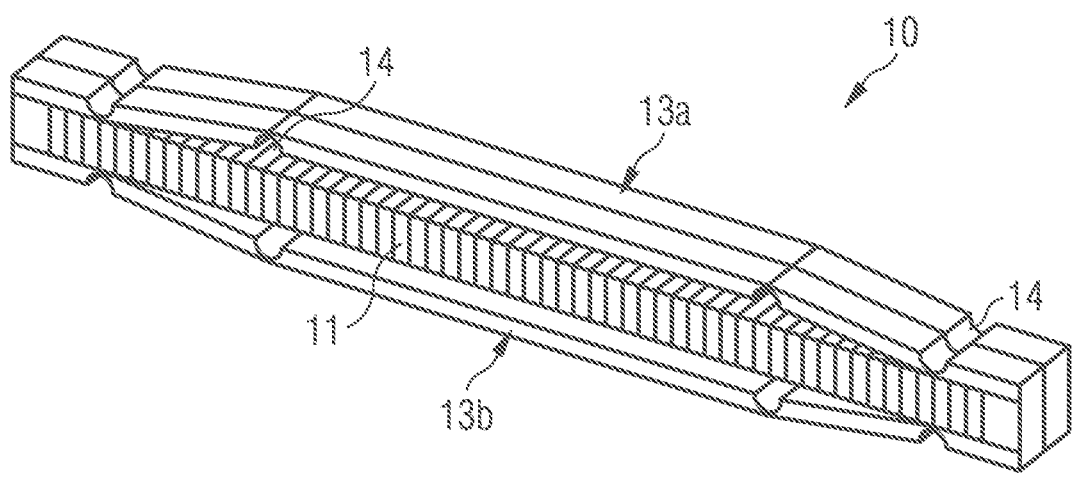

FIG. 1 shows a device for producing haptic feedback in accordance with the prior art;

FIG. 2 shows a sectional view of a device for producing haptic feedback;

FIG. 3 shows a perspective view of a partial region of the device in accordance with FIG. 2;

FIG. 4 shows a perspective view of the device in accordance with FIG. 2;

FIG. 5 shows a perspective view of a device for producing haptic feedback in accordance with a further exemplary embodiment; and FIG. 6 shows a device integrated as a drive for haptic feedback into an electronic apparatus according to an embodiment.

DETAILED DESCRIPTION OF ILLUSTRATIVE EMBODIMENTS

FIG. 1 shows a device for producing haptic feedback in accordance with the prior art. The device comprises a piezoelectric actuator 1 comprising a multiplicity of piezoelectric layers 1a and internal electrodes arranged therebetween. The piezoelectric layers 1a are stacked in the longitudinal direction. A respective metallization 2 is formed at opposite outer surfaces of the actuator 1. The actuator 1 is arranged in a metal housing 3, for example, which serves for stroke amplification.

The device known according to the prior art exploits the longitudinal piezoelectric effect (d33 effect). In longitudinal actuators, the electric field is applied in the ceramic layer parallel to the direction of polarization. This induces an extension or deflection in the direction of polarization. In this case, individual piezoelectric layers 1a yield relatively small deflections. In order to achieve technically usable deflection values, stacked actuators are used, therefore, in which a multiplicity of piezoelectric layers 1a are interconnected mechanically in series and electrically in parallel.

Consequently, the piezoelectric actuator 1 is very complex and manufactured with large dimensions, as a result of which the device becomes voluminous and expensive. Furthermore, the piezoelectric layers 1a of the actuator 1 have a very stiff and inefficient transmission.

In contrast thereto, FIGS. 2 to 5 show a device 10 according to embodiments of the invention for producing haptic feedback, which eliminates the disadvantages mentioned above. FIGS. 2 to 4 will firstly be considered in detail below.

The device 10 comprises a piezoelectric actuator 11. The piezoelectric actuator 11 constitutes a sintered component having a multiplicity of piezoelectric layers 22 and internal electrodes 21. The piezoelectric actuator 11 comprises in particular a multiplicity of piezoelectric or active layers 22 arranged one above another to form a stack. By way of example, the piezoelectric actuator 11 can comprise up to 100 piezoelectric layers 22, e.g., 70 piezoelectric layers 22. The internal electrodes 21 are arranged between the piezoelectric layers 22 (FIG. 2). In this case, internal electrodes 21 of different polarities are arranged alternately.

The piezoelectric layers 22 can be lead zirconate titanate ceramics (PZT ceramics). The PZT ceramic can furthermore additionally contain Nd and Ni. Alternatively, the PZT ceramic can furthermore additionally comprise Nd, K and, if appropriate, Cu. Alternatively, the piezoelectric layers can have a composition containing $Pb(Zr_xTi_{1-x})O_3 + y\ Pb(Mn_{1/3}Nb_{2/3})O_3$.

The piezoelectric layers 22 have a stacking direction S (FIG. 2). The stacking direction S extends along end or side faces 24 of the actuator 11. In particular, the piezoelectric layers 22 are stacked along a vertical extent or thickness of the actuator 11.

The actuator 11 has a width or first horizontal extent of less than or equal to 10 mm, for example, 5 mm. The actuator 11 has a length or second horizontal extent of less than or equal to 100 mm, for example, 60 mm. The actuator 11 can have, for example, a basic area of 5 mm×60 mm (width×length). The actuator 11 preferably has a vertical extent or thickness that is less than or equal to 3 mm. By way of example, the respective piezoelectric layer 22 has a thickness of less than or equal to 40 µm, for example, 39 m.

The actuator 11 has two insulation regions 12 (see FIG. 3). The respective insulation region 12 is formed in an end region of the actuator 11. In particular, the respective insulation region 12 is formed in the region of an end face 24 of the actuator 11. The respective insulation region 12 has a length of less than or equal to 2 mm.

In the insulation region 12 only internal electrodes 21 of one polarity extend as far as the end face 24 of the actuator 11. The insulation region 12 can be used for contacting the actuator 11. By way of example, the respective insulation region 12 can be provided with external electrodes 23 for electrical contacting (FIG. 2).

The actuator 11 is configured such that when an electrical voltage is applied, a deformation of the actuator 1 takes place (expansion in direction R1, see FIGS. 2 and 3). In particular, the piezoelectric layers 22 are polarized in such a way that applying an electrical voltage between the internal electrodes 21 leads to a transverse contraction of the actuator 11, in the case of which the length of the actuator 11 changes perpendicular to the stacking direction S. An expansion of the actuator 1 thus takes place transversely with respect to the polarization direction and with respect to the electric field (d31 effect).

In order to further reinforce the effect of the change in length in the stacking direction S, the device comprises two reinforcing elements 13a, 13b. If voltage is applied to the actuator 11, then the reinforcing elements 13a, 13b deform at least partly on account of the change in the expansion of the actuator 11, as will be described in detail later.

The actuator 11 is arranged between the reinforcing elements 13a, 13b. The reinforcing elements 13a, 13b bear at least partly on a top side 25 and respectively an underside 26 of the actuator 11. The respective reinforcing element 13a, 13b preferably has a width that corresponds to the width of the actuator 11. The same preferably applies to the length of the reinforcing elements 13a, 13b. Preferably, the respective reinforcing element 13a, 13b has a basic area of 5 mm×60 mm (width×length).

The respective reinforcing element 13a, 13b is formed in integral fashion. The respective reinforcing element 13a, 13b has a rectangular shape. The respective reinforcing element 13a, 13b is formed in strip-shaped fashion. The respective reinforcing element 13a, 13b is formed in curved or bent fashion. By way of example, the respective reinforcing element comprises a sheet-metal strip. The sheet-metal strip is bent, as explained in detail below.

Each of the integral reinforcing elements 13a, 13b is subdivided into a plurality of regions or sections. In this regard, the respective reinforcing element 13a, 13b has a partial region or first region 17a, 17b. The partial region 17a, 17b respectively has a first section or central region 19a, 19b (FIG. 4). The central region 19a, 19b has a length of less than or equal to 4 mm, preferably 3 mm.

The partial region 17a, 17b furthermore respectively has two second sections or connection regions 20a, 20b (FIGS. 2 and 4). The two connection regions 20a, 20b of the respective reinforcing element 13a, 13b are directly adjacent to the central region 19a, 19b of the respective reinforcing element 13a, 13b. In other words, the central region 19a, 19b of the respective reinforcing element 13a, 13b is surrounded by the two connection regions 20a, 20b toward both sides.

The respective reinforcing element 13a, 13b furthermore has two end regions 18a, 18b. The respective end region 18a, 18b preferably has a length of less than or equal to 5 mm, for example, 4.5 mm. The end regions 18a, 18b are directly adjacent to the connection regions 20a, 20b of the respective reinforcing element 13a, 13b. In other words, a respective connection region 20a, 20b connects an end region 18a, 18b to the central region 19a, 19b of a reinforcing element 13a, 13b.

The two end regions 18a, 18b of the respective reinforcing element bear directly on a surface of the actuator 11. In this regard, the first and second end regions 18a of the first reinforcing element 13a bear on a partial region of the top side 25 of the actuator 11. Furthermore, the first and second end regions 18b of the second reinforcing element 13b bear on a partial region of the underside 26 of the actuator 11.

The end regions 18a, 18b are preferably connected to the surface of the actuator 11 in a non-releasable manner. In particular, the end regions 18a, 18b are connected to the surface of the actuator 11 by means of an adhesive-bonding connection. An underside of the respective end region 18a, 18b together with a partial region of the top side 25 and respectively underside 26 of the actuator 11 form an adhesive-bonding surface 15 (FIGS. 3 and 4). Adhesive material is applied on the adhesive-bonding surface 15 and the reinforcing elements 13a, 13b are connected to the actuator 11 in this way. By using an adhesive-bonding connection instead of a clamping connection, for example, it is possible for the geometry of the reinforcing elements 13a, 13b to be kept very simple.

The respective partial region 17a, 17b is at a distance from the surface of the actuator 11. In particular, a free region 16 (FIGS. 2 and 3) is situated between the respective partial region 17a, 17b and the underside 26 and respectively the top side 25 of the actuator 11. The free region 16 has a height h (FIG. 3). The maximum height h and thus the maximum distance between the actuator 11 and the partial region 17a, 17b is preferably less than or equal to 3 mm, preferably 2.5 mm. This results in a maximum total thickness of the device 10 of preferably 10 mm.

The height h of the free region 16 varies along the respective partial region 17a, 17b. In this regard, the central region 19a, 19b of the respective partial region 17a, 17b is configured such that it extends parallel to the surface of the actuator 11. The height h of the free region 16 is thus maximal in the region of the central region 19a, 19b. By contrast, the respective connection region 20a, 20b extends obliquely with respect to the surface of the actuator 11. In other words, the respective connection region 20a, 20b forms an angle with the top side 25 and respectively the underside 26 of the actuator 11. The angle is preferably less than or equal to 45°. The height h of the free region 16 thus decreases in the direction from the central region 19a, 19b toward the end region 18a, 18b of the respective reinforcing element 13a, 13b. Consequently, the respective reinforcing element 13a, 13b has a bent shape.

The respective reinforcing element 13a, 13b furthermore has at least one thinned portion 14, preferably a plurality of thinned portions 14. In FIGS. 2 to 5, the respective reinforcing element 13a, 13b has four thinned portions 14. In this case, the thinned portions 14 can be regarded as a region in which the respective reinforcing element 13a, 13b is thinner, that is to say has a smaller vertical extent or thickness than in the remaining region. A thinned portion 14 preferably has a depth or vertical extent of less than or equal to 0.8 mm, preferably 0.75 mm. The maximum thickness of the respective reinforcing element 13a, 13b is preferably 1 mm. At the location of a thinned portion 14, the respective reinforcing element 13a, 13b thus has a residual thickness of 0.25 mm.

The thinned portions 14 comprise notches, for example. The thinned portion 14 can have a semicircular shape. However, the shape of the respective thinned portion 14 is unimportant for the function thereof. The thinned portions 14 are formed at a top side and/or underside of the respective reinforcing element 13a, 13b. By way of example, the thinned portions 14 are stamped or milled in the top side and/or the underside.

The thinned portions 14 can be open outward. For the respective reinforcing element 13a, 13b this means that the thinned portion 14 can be arranged at an outer side of the reinforcing element 13a, 13b which faces away from the top side 25 and respectively underside 26 of the actuator 11. The thinned portions 14 can also be open inward. For the respective reinforcing element 13a, 13b this means that the thinned portion 14 can be arranged at an outer side of the reinforcing element 13a, 13b which faces toward the top side 25 and respectively underside 26 of the actuator 11. The respective reinforcing element 13a, 13b can have both inwardly and outwardly open thinned portions 14. The respective reinforcing element 13a, 13b can also have only one-sided thinned portions 14, that is to say thinned portions 14 which are open either outward or inward.

The thinned portions 14 are provided to the effect that the reinforcing element 13a, 13b can bend at the location of the thinned portion 14 upon deflection of the actuator 11.

The thinned portions 14 are preferably formed in transition regions of the respective reinforcing element 13a, 13b. A thinned portion 14 is formed here in each case in the transition region between connection region 20a, 20b and end region 18a, 18b. These thinned portions 14 are open inward in the exemplary embodiment according to FIGS. 2 to 4. Furthermore, a respective thinned portion 14 is found in the transition region between central region 19a, 19b and connection region 20a, 20b. These thinned portions 14 are open outward in the exemplary embodiment according to FIGS. 2 to 4.

In accordance with a further exemplary embodiment (FIG. 5), however, the thinned portions 14 can also be "turned over" in order to reduce the total height of the device 10. In this regard, in FIG. 5, the thinned portions 14 in the transition region between connection region 20a, 20b and end region 18a, 18b are open outward. The thinned portions 14 in the transition region between central region 19a, 19b and connection region 20a, 20b are open inward. If the maximum height 6 of the free region 16 is set at only 1.16 mm, then the total height of the device 10 from FIG. 5 is only less than or equal to 7.5 mm, preferably 7.36 mm.

In the transition regions the reinforcing element 13a, 13b must bend if the actuator 11 deforms. The thinned portions 14 ensure the necessary flexibility of the reinforcing element 13a, 13b. As a result, transmission becomes movable for the actuator 11 and stiff for the load, for example, a touch-sensitive screen. The efficiency of the transmission is increased as a result.

If voltage is then applied to the actuator 11, the partial regions 17a, 17b of the respective reinforcing element 13a, 13b move relative to the actuator 11 in a second direction R2 (FIGS. 2 and 3). The second direction R2 is perpendicular to the first direction R1. The second direction R2 extends along the stacking direction S.

In particular, the central regions 19a, 19b move in the direction R2. In this case, the respective reinforcing element 13a, 13b bends at the location of the thinned portions 14 between central region 19a, 19b and connection regions 20a, 20b and also between connection regions 20a, 20b and end regions 18a, 18b.

By contrast, a movement of the end regions 18a, 18b in the second direction R2 is prevented by the adhesive-bonding connection to the actuator 11. Rather, the end regions 18a, 18b move with the actuator 11 in the first direction R1. As a result of the flexibility of the reinforcing elements 13a, 13b, the loading of the adhesive bonds here is limited to less than or equal to 50 MPa. A relative movement between the end regions 18a, 18b and the partial regions 17a, 17b thus takes place. The haptic feedback of the device 10 is brought about by the relative movement of the respective end region 18a, 18b with respect to the respective partial region 17a, 17b.

If the device 10 is integrated as a drive for haptic feedback into an electronic apparatus, then the reinforcing elements 13a, 13b are preferably secured to mechanical elements (for example, a screen 40 and a weight 30). The mechanical elements 30, 40 are thus moved relative to one another upon a deformation of the piezoelectric actuator 11. In other words, the screen 40 is offset laterally (parallel to the screen surface) and haptic feedback is produced as a result. This is shown in FIG. 6.

Displacements in the range of 100 μm to 150 μm are conceivable. Individual excursions (offset and return offset) are also possible. An offset is intended generally to have a duration of between 7 ms and 10 ms. The lateral offset is employed since in the case of a vertical offset (perpendicular to the surface), owing to the low flexural strength of the screen 40, the screen 40 would have to be driven at a plurality of locations. The use of a device 10 as described above is sufficient in the case of a lateral offset.

The screens generally have a mass of between 300 g and 400 g. Screen 40 and device 10 (drive) in a simplified depiction are an oscillatory mass-spring system. The resonant frequency $f_0$ (frequency of the free oscillation without excitation) results as: $f_0 = 1/2\pi \cdot \sqrt{(D/m)}$. In this case, D is the stiffness of the drive 10 and m is the mass of the screen 40. $f_0$ must be greater than the reciprocal of the excursion duration T, otherwise the screen 40 does not move or only partly moves concomitantly. It thus holds true that: $D \geq m(2\pi/T)^2$. Given T=7 ms and m=400 g this results in a minimum stiffness of 0.32 N/μm for the device 10 (drive).

For the above-described device 10 in accordance with FIGS. 2 to 5, given a voltage of 100 V, this results in a stroke of 117 μm, a blocking force of 46 N and thus a stiffness of 0.4 N/μm.

To compare the performance capability of a transmission, it is possible to use the maximum energy $E_{max}$ able to be transmitted, for a given actuator 11 with driving. $E_{max}$=(free travel·blocking force)/2. This value is 2.7 mJ for the device described above.

In the case where the thinned portions 14 according to embodiments of the invention are absent and with an assumed thickness of the respective reinforcing element 13a, 13b of 0.5 mm and height h of 1.75 mm, a deflection of only 102 μm would be achieved, and a blocking force of 40 N. This would result in a stiffness of 0.38 N/μm and Emax of 2.0 mJ.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An assembly comprising:
   a screen with a screen surface; and
   a device for producing haptic feedback, the device comprising:
      at least one piezoelectric actuator comprising a plurality of piezoelectric layers;
      a first reinforcing element; and
      a second reinforcing element,
      wherein the piezoelectric actuator is arranged between the reinforcing elements,
      wherein the piezoelectric actuator is configured to alter its expansion in a first direction when an electrical voltage is applied,
      wherein the first reinforcing element is configured to deform on account of an alteration in the expansion in the first direction of the piezoelectric actuator such that a central region of the first reinforcing element is moved relative to the piezoelectric actuator in a second direction, the second direction being perpendicular to the first direction,
      wherein the second reinforcing element is configured to deform on account of the alteration in the expansion in the first direction of the piezoelectric actuator such that a central region of the second reinforcing element is moved relative to the piezoelectric actuator in a third direction, the third direction being perpendicular to the first direction and opposite to the second direction,
      wherein the device is configured to bring about an offset of the screen parallel to the screen surface,
   wherein the assembly is constructed such that $D \geq m(2\pi/T)^2$ holds true, and
   wherein D is a stiffness of the device, m is a mass of the screen, and T is an excursion duration of the assembly.

2. The assembly according to claim 1,
   wherein the piezoelectric actuator is configured such that the alteration in the expansion in the first direction of the piezoelectric actuator takes place transversely with respect to a polarization direction of the piezoelectric layers and with respect to an electric field such that the piezoelectric actuator is operated based on a $d_{31}$ effect.

3. The assembly according to claim 1,
   wherein the piezoelectric actuator comprises a top side and an underside, which are opposite to each other in the second direction,
   wherein the first reinforcing element comprises:
      a partial region including the central region, and
      at least one end region directly adjacent to the partial region,
   wherein the at least one end region of the first reinforcing element is configured such that upon the alteration in the expansion of the piezoelectric actuator, a movement of the at least one end region in the second direction with respect to the top side of the piezoelectric actuator does not occur,
   wherein the second reinforcing element comprises:
      a partial region including the central region, and
      at least one end region directly adjacent to the partial region, and
   wherein the at least one end region of the second reinforcing element is configured such that upon the alteration in the expansion of the piezoelectric actuator, a movement of the at least one end region in the second direction with respect to the underside of the piezoelectric actuator does not occur.

4. The assembly according to claim 3, wherein two end regions of the first reinforcing element are connected to the top side of the piezoelectric actuator in a non-releasable manner, and wherein two end regions of the second reinforcing element are connected to the underside of the piezoelectric actuator in a non-releasable manner.

5. The assembly according to claim 3, wherein each end region abuts directly the piezoelectric actuator.

6. The assembly according to claim 3, wherein each end region and the piezoelectric actuator are connected to one another by an adhesive connection.

7. The assembly according to claim 3, wherein each partial region is arranged at a distance from a surface of the piezoelectric actuator.

8. The assembly according to claim 3, wherein the first reinforcing element has two end regions and a partial region which is arranged between the two end regions, and wherein the second reinforcing element has two end regions and a partial region which is arranged between the two end regions.

9. The assembly according to claim 1, wherein the first reinforcing element has at least one thinned portion and is configured to bend at a location of the thinned portion upon a movement in the second direction, and wherein the second reinforcing element has at least one thinned portion and is configured to bend at a location of the thinned portion upon a movement in the third direction.

10. The assembly according to claim 9, wherein each thinned portion has an indentation in a surface of the respective reinforcing element.

11. The assembly according to claim 9, wherein each reinforcing element has a plurality of thinned portions.

12. The assembly according to claim 9, wherein each thinned portion is located in a transition region between the central region and an end region of a respective reinforcing element.

13. The assembly according to claim 9, wherein a partial region of the first reinforcing element comprises the central region and at least one connection region, wherein the central region extends parallel to a surface of the piezoelectric actuator, and wherein a thinned portion is located in a transition region between the central region and the connection region of the first reinforcing element, wherein a partial region of the second reinforcing element comprises the central region and at least one connection region, wherein the central region extends parallel to the surface of the piezoelectric actuator, and wherein a thinned portion is located in a transition region between the central region and the connection region of the second reinforcing element.

14. The assembly according to claim 1, wherein each reinforcing element is formed in integral fashion.

15. The assembly according to claim 1, wherein the haptic feedback is generated by the offset of the screen parallel to the screen surface.

* * * * *